United States Patent [19]

Said

[11] Patent Number: 5,075,619

[45] Date of Patent: Dec. 24, 1991

[54] METHOD AND APPARATUS FOR MEASURING THE FREQUENCY OF A SPECTRAL LINE

[75] Inventor: Ahmed M. F. Said, Beaverton, Oreg.

[73] Assignee: Tektronix, Inc., Beaverton, Oreg.

[21] Appl. No.: 505,878

[22] Filed: Apr. 6, 1990

[51] Int. Cl.[5] .................. G01R 23/16; G01R 27/02
[52] U.S. Cl. .................... 324/77 F; 324/77 E; 324/78 F; 364/485
[58] Field of Search ............ 356/27; 364/572, 484, 364/485; 342/14, 16, 17; 333/167, 203; 324/77 E, 77 F, 77 C, 77 D

[56] References Cited

U.S. PATENT DOCUMENTS

| | | |
|---|---|---|
| 3,215,934 | 11/1965 | Sullen . |
| 3,774,201 | 11/1973 | Collins . |
| 4,034,299 | 7/1977 | Cho .................. 324/77 F |
| 4,301,454 | 11/1981 | Bailey . |
| 4,328,497 | 5/1982 | Vale . |
| 4,610,540 | 9/1986 | Mossey . |
| 4,739,331 | 4/1988 | Pincoffs et al. . |
| 4,973,897 | 11/1990 | Ohsawa .............. 324/77 E |

FOREIGN PATENT DOCUMENTS 553548  5/1977  U.S.S.R. .................. 324/77 E

Primary Examiner—Kenneth A. Wieder
Assistant Examiner—Jose M. Solis
Attorney, Agent, or Firm—Boulden G. Griffith; Francis I. Gray

[57] ABSTRACT

A method and apparatus are disclosed, that is suitable for digital or analog spectrum analyzers, for accurately and rapidly ascertaining the frequency of a spectral line by determining its location from the response of two Gaussian shaped filters whose center frequencies bracket the frequency of the spectral line. The difference is taken between the amplitudes in decibels of the responses of the two Gaussian filters to the spectral line input signal. The frequency of the spectral line is then found from the linear relationship fx=delta-log-ampl.*c1+c2, where c1 is proportional to the square of the standard deviation of the Gaussian filters and inversely proportional to the difference between the center frequencies, f1 and f2, of the Gaussian filters times the logarithm of e, and where c2 is the midpoint between the center frequencies, f1 and f2, of the Gaussian filters, G1 and G2. Alternatively, a sweeping local oscillator output can be mixed with the signal containing the spectral line of unknown frequency and the resulting signal applied to one Gaussian filter at two different times to produce equivalent results. In this case, c1 is proportional to the square of the standard deviation of the Gaussian filter and inversely proportional to the difference between the local oscillator frequencies, f,LO+1 and f,LO+2, at times t1 and t2, times the logarithm of e, and c2 is the average of the local oscillator frequencies, f,LO+1 and f,LO+2, plus f, the center frequency of the Gaussian filter.

5 Claims, 4 Drawing Sheets

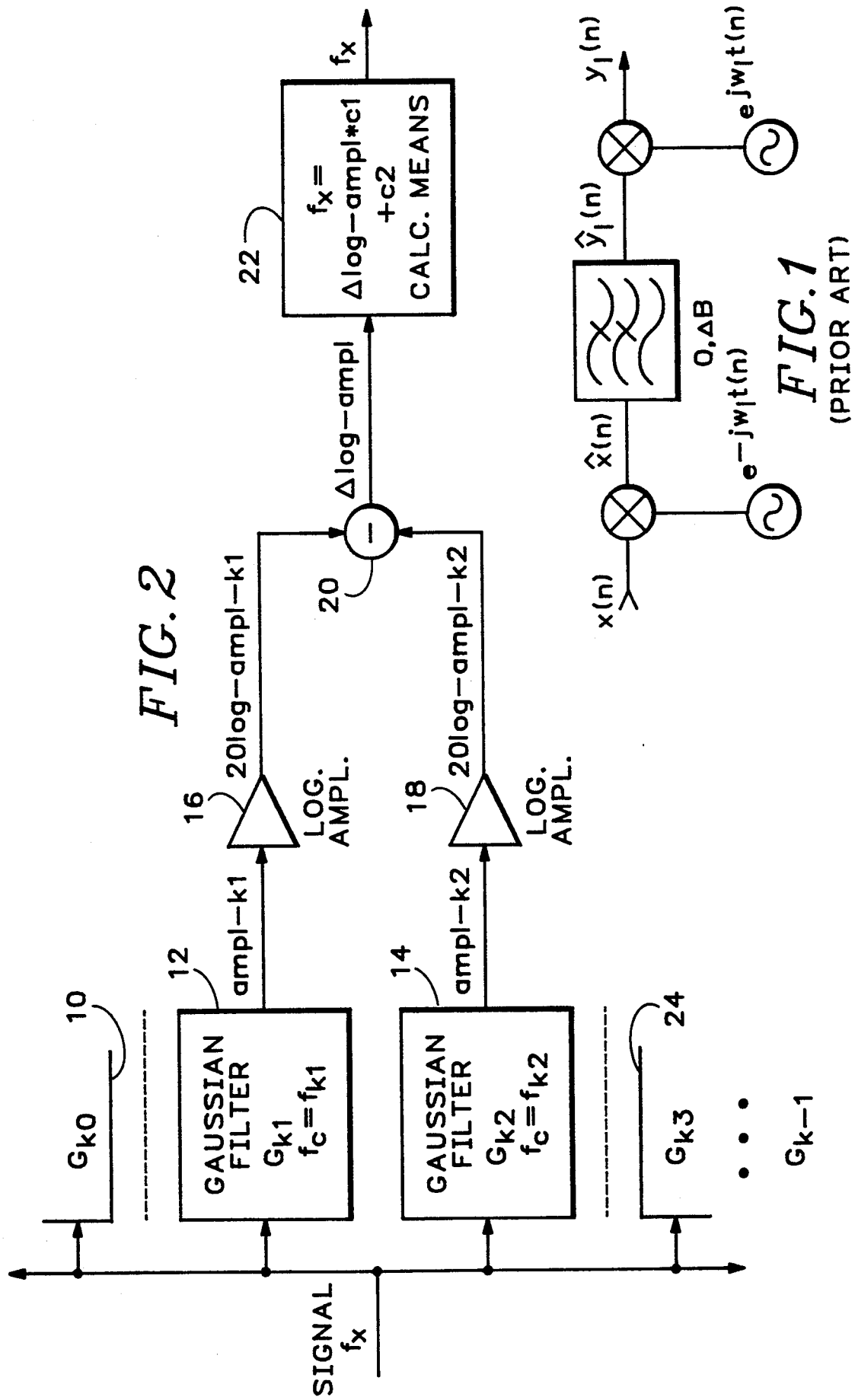

METHOD AND APPARATUS FOR MEASURING THE FREQUENCY OF A SPECTRAL LINE

BACKGROUND OF THE INVENTION

This invention relates to the field of frequency measurement and analysis, and more particularly to the field of accurately measuring the frequency of individual spectral lines from the responses of two filters, or from the response of one filter as the spectral line is moved with respect to that filter's center frequency by a sweeping local oscillator.

A spectrum analyzer is an electronic instrument for providing a frequency domain view of an electrical signal, i.e., how the energy of the signal is distributed in terms of frequency. Many spectrum analyzers, both digital and analog, rely on banks of filters to determine the amount of energy occurring at different frequencies. In an analog spectrum analyzer, a number of physical filters tuned to different frequencies each respond to an input signal that may be shifted in frequency by mixing with a local oscillator.

Digital spectrum analyzers can apply the same principle using digital filters instead of analog ones. These analyzers first sample and digitize the activity of the signal under analysis to produce a series of time domain digitized samples. The sampling rate must be at least twice as high as the bandwidth of interest. Those time domain samples are then applied to a bank of digital band pass filters tuned to different frequencies to cover the frequency band of the input signal. The output of those filters can be sampled (simultaneously) at a rate proportional to their bandwidth, to avoid aliasing.

Generally, one of several variations of the Discrete Fourier Transform (DFT), usually the Fast Fourier Transform (FFT), is used to build the bank of filters. These methods are described in detail in "Digital Signal Processing" by Oppenheim and Schafer (Prentice-Hall, Inc. 1975), which is hereby incorporated by reference, in "Multirate Digital Signal Processing" by Crochiere and Rabiner (Prentice-Hall, 1983), which is also hereby incorporated by reference, and many other books and papers.

As explained in Chapter 7 of "Multirate Digital Signal Processing" by Crochiere and Rabiner (Prentice-Hall, 1983), there are methods available that allow the time record length, M, and the number of output filter bins, K, to be different. The "polyphase structure" approach allows M to be any integer multiple of K. The "weighted overlap-add structures" approach removes that constraint, permitting M to be larger than K without being an integer multiple of it. However, using the longer time records required for a larger M is computationally expensive, adding to the time and/or compute resources required for each complete DFT calculation.

The shape of each of the output filters, i.e. its frequency response, and hence its impulse response, is independent of the number of filters. The number of samples in the time record and the number of output bins or filters are selectable, and may differ from each other, but the implementation of the FFT algorithm requires that the number of filters to be equal to the radix of the FFT raised to the power of an integer number.

If separate individual, but identical, filters are used to cover a given analysis span with Fs/K frequency resolution, K individual filters with incrementally adjusted center frequencies are necessary to create a filter bank covering that span. If additional analysis spans are desired, additional corresponding filter banks are necessary. This multiplicity of hardware rapidly becomes prohibitive.

However, if the available hardware is fast enough, it is possible to build fewer filters, for example, m filters, where m<K. This can be done by time sharing the hardware between the lesser number of filters to achieve the K required filters. This time sharing approach can be implemented in either of two ways. Either the hardware for a single band pass filter can be shared between K/m filters by changing the center frequency of the hardware. Or, the hardware of a single low pass filter can be shared between K/m filters by demodulating the input signal by different frequencies, each of which corresponds to the desired filter center frequencies. These demodulated signals are then put through the single low pass filter and then remodulated back up by the same amount that they were demodulated previously.

Both of these approaches are equivalent. However, in one case, the filter is moved with respect to the signal, while in the other case, the signal is moved with respect to the filter. FIG. 1 illustrates the hardware equivalent of the latter approach.

By performing this demodulation, remodulation process in rapid sequence for incremented center frequencies, a single hardware realized filter can be time-shared into a bank of equally spaced filters. To do this it is necessary to sample the output at a rate of r*Fs/K, where Fs is the sampling frequency of the input signal, r is a constant that depends on the filter shape, and K is the number of filter increments across the desired analysis span. The relationship between Fs and the frequency span is determined by the Nyquist theorem.

The relationship of K and M can be modified to be M=Q*K where Q is an integer. M can always be made to satisfy this relationship by adding "0" terms. This separation of K and M permits any filter shape to be realized, at least theoretically.

A wide variety of filter shapes have also been employed by the designers of analog spectrum analyzers. One of the filter shapes used in analog spectrum analyzers and in radars is a Gaussian filter shape (equation 1).

$$G(f) = \frac{1}{\sigma_f \sqrt{2\pi}} e^{-\frac{(f_x - f_c)^2}{2\sigma_f^2}} \quad (1)$$

where $\sigma_f$ is one standard deviation measured in frequency, $f_c$ is the center frequency, and $f_x$ is any frequency of interest.

These filters have traditionally been valued for several of their characteristics, including their signal extraction abilities and transient response functions. For example, U.S. Pat. No. 3,774,201 to Collins for a "Time Compression Signal Processor" teaches, at column 13, lines 14–19, "Filters with more nearly rectangular characteristic curves would be better suited for straight forward spectrum analysis, but part of the problem in a radar system is extracting the signal from a noisy background; Gaussian filters were better at extracting the signal."

U.S. Pat. No. 4,610,540 to Mossey for a "Frequency Burst Analyzer", hereby incorporated by reference, shows multiple filters being used to interpolate the location of signals between the center frequencies of the filters. At column 5, lines 7-62, of this Mossey patent, three methods of interpolating the location of a signal are described, collectively referred to as alternative means of "regression analysis". All of the methods taught by Mossey are somewhat complex and computationally time consuming, as well as requiring the output of as many as four filters to accurately determine the result.

What is desired is a method and apparatus for determining the location of a spectral line between the center frequencies of two adjacent filters, or one filter if the signal is moved with respect to its center frequency, that is fast and accurate and is suitable for use in digital as well as analog spectrum analyzers.

SUMMARY OF THE INVENTION

Accordingly, the present invention is a method and apparatus suitable for digital or analog spectrum analyzers for accurately and rapidly ascertaining the frequency of a spectral line by determining its location from the response of two filters, or one filter if the signal is moved with respect to its center frequency, to the signal containing the spectral line. The difference is taken between the logarithms of the amplitudes of the responses from two filters having a Gaussian filter shape. The frequency of the spectral line is then found according to the relationship:

$$f_x = \Delta dB \times c_1 + c_2 \quad (2)$$

where c1 and c2 are defined according to equations 3 and 4, respectively.

$$c_1 = \frac{\sigma_f^2}{20(f_{k1} - f_{k2})\log_{10} e} \quad (3)$$

$$c_2 = \frac{f_{k1} + f_{k2}}{2} \quad (4)$$

Alternatively, a sweeping local oscillator output can be mixed with the signal containing the spectral line of unknown frequency and the resulting signal applied to one Gaussian filter at two different times to produce equivalent results.

Using this technique, the degree of measurement accuracy can be determined in advance by the choice of sigma-f.

BRIEF DESCRIPTION OF THE DRAWINGS

FIG. 1 is a block diagram of the hardware equivalent of the digital demodulation and remodulation technique of the prior art.

FIG. 2 is a conceptual block diagram of the functions necessary to practice the present invention.

DETAILED DESCRIPTION

Figure 3:
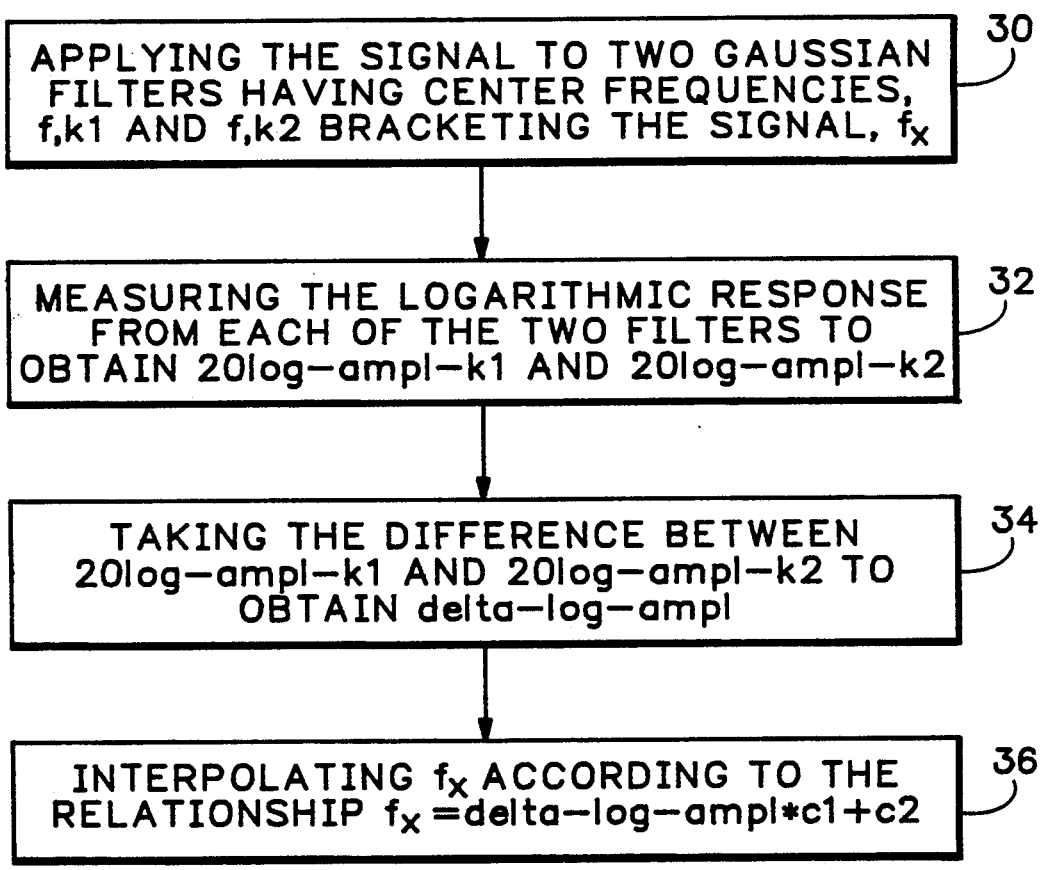
FIG. 3 is a flow chart of the procedure illustrated in block diagram form in FIG. 2.

Gaussian functions have the interesting property of remaining Gaussian as they are transformed back and forth between the time and frequency domains. Thus, when a set of weighting coefficient data fitting the Gaussian relationship shown in equation 5 is applied to the input of a means for performing the Discrete Fourier Transform (DFT), the Gaussian filter shape of equation 1 appears on the output filter bins of the DFT means.

$$G(t) = \frac{1}{\sigma_t \sqrt{2\pi}} e^{-\frac{(t-t_c)^2}{2\sigma_t^2}} \quad (5)$$

where $\sigma_t$ is one standard deviation measured in time increments, $t_c$ is the center of the time record, and $t$ is any location in the time record.

Referring to FIG. 2, a signal containing a pure sinusoid of unknown frequency fx is applied to a bank of filters, G,0 to G,K-1, having center frequencies f,k0 to f,k-1. This unknown signal fX happens to have a frequency somewhere between the center frequencies f,k1 and f,k2 of Gaussian filters GK1 12 and GK2 14. Gaussian filter GK1 12 with its center frequency at f,k1 produces an amplitude response ampl-k1. Gaussian filter GK2 14 with its center frequency at f,k2 produces an amplitude response ampl-k2.

Logarithmic amplifier 16 receives the output of Gaussian filter GK1 12 ampl-k1 and produces a signal 20log-ampl-k1 representative of that input. Similarly, logarithmic amplifier 18 receives the output of Gaussian filter GK2 14 ampl-k2 and produces a signal 20log-ampl-k2 representative of that input. Difference circuit 20 compares the output of logarithmic amplifier 16 and logarithmic amplifier 18 and produces a signal, delta-log-ampl, proportional to their difference A calculation means 22 interpolates the unknown frequency of the input sinusoid signal fx according to equation (2).

Referring to FIG. 3, the method illustrated in FIG. 2 is initiated by applying (step 30) the sinusoidal signal of unknown frequency to two Gaussian filters. This step is easily accomplished for a whole span of frequencies when a bank of overlapping filters are employed. Two such filters are shown in FIG. 2 as Gaussian filters GK1 12 and GK2 14.

Equation 1 represents the output of any one of the resulting filter bin outputs. Equation 6 shows the difference between the amplitude output of two adjacent filters, GK1 and GK2, converted to decibels. Equation 7 is a simplification of equation 6, with the first and third terms on the right cancelled out and some other rearrangements, and with the left side expressed more directly as a decibel difference.

$$20\log G_{k1}(f_x) - 20\log G_{k2}(f_x) = 20\log \frac{1}{\sigma_f \sqrt{2\pi}} - \quad (6)$$

$$\frac{20\log_{10} e}{2\sigma_f^2} (f_x - f_{k1})^2 - 20\log \frac{1}{\sigma_f \sqrt{2\pi}} - \frac{20\log_{10} e}{2\sigma_f^2} (f_x - f_{k2})^2$$

$$\Delta dB = \frac{-20\log_{10}e}{2\sigma_f^2} [(f_x^2 - 2f_x f_{k1} + f_{k1}^2) - (f_x^2 - 2f_x f_{k2} + f_{k2}^2)] \quad (7)$$

where ΔdB is the difference between 20 log $G_{k1}(f_x)$ and 20 log $G_{k2}(f_x)$.

The next step in FIG. 3, measuring (step 32) the logarithmic response from each of the two filters to obtain 20log-ampl-k1 and 20log-ampl-k2, corresponds to the logarithmic amplifiers 16 and 18 of FIG. 2. These values are those used in equation 6. The next step in FIG. 3, taking (step 34) the difference between 20log-ampl-k1 and 20log-ampl-k2 to obtain delta-log-ampl, is mathematically illustrated in equations 6 and 7.

Further rearrangement of equation 7 leads to equation 2 above, where c1 and c2 are defined according to equations 3 and 4. The final step shown in FIG. 3, interpolating (step 36) fX is described mathematically by equations 2, 3, and 4 above.

Figure 4:
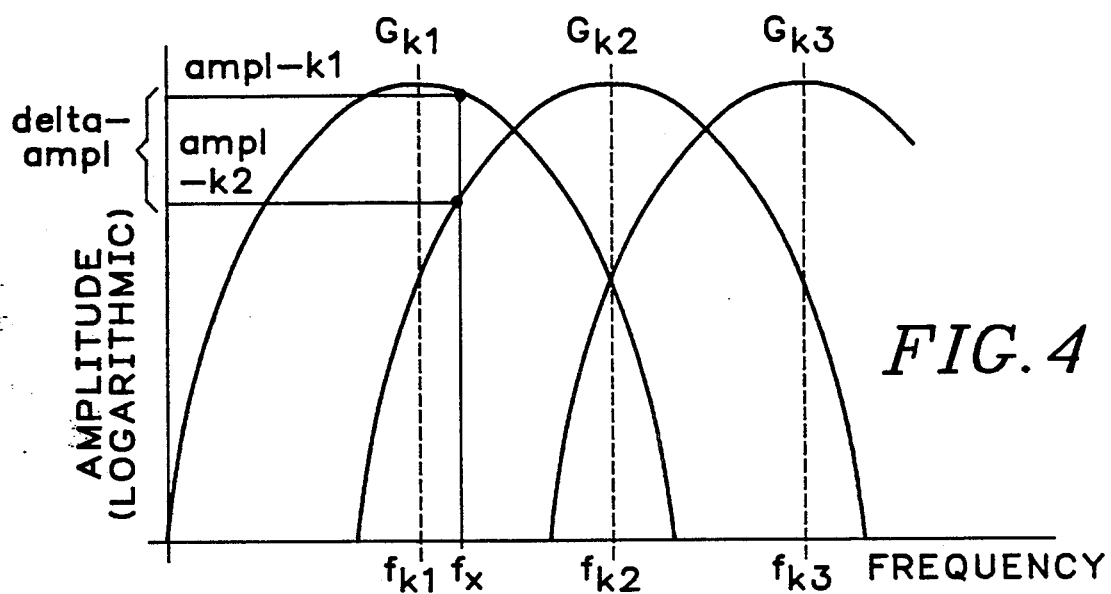
FIG. 4 shows the response of two Gaussian filters as a plot of frequency versus logarithmic amplitude.

The logarithm of a Gaussian distribution is a parabola. FIG. 4 shows the power output of two filters according to the present invention in logarithmic form. Filter GK1 has a center frequency f,k1 and filter GK2 has a center frequency f,k2. A spectral line is measured by both filters at frequency fx. Filter GK1 responds to the signal by producing logarithmic amplitude indication ampl-k1. Filter GK2 responds to the signal by producing logarithmic amplitude indication ampl-k2. The difference between ampl-k1 and ampl-k2, delta-ampl, is used in accordance with equation 2 to find the interpolated frequency of the spectral line, fx.

The slope of equation 2, c1, determines the frequency resolution attainable with this approach. When c1 is small, a given change in frequency shows up as larger and more easily measurable changes in delta-ampl. Conversely, the bigger c1 is, the less delta-ampl is associated with a given change in frequency. Larger values of c1 lower the frequency resolution, while smaller values of c1 increase the frequency resolution.

Figure 5:
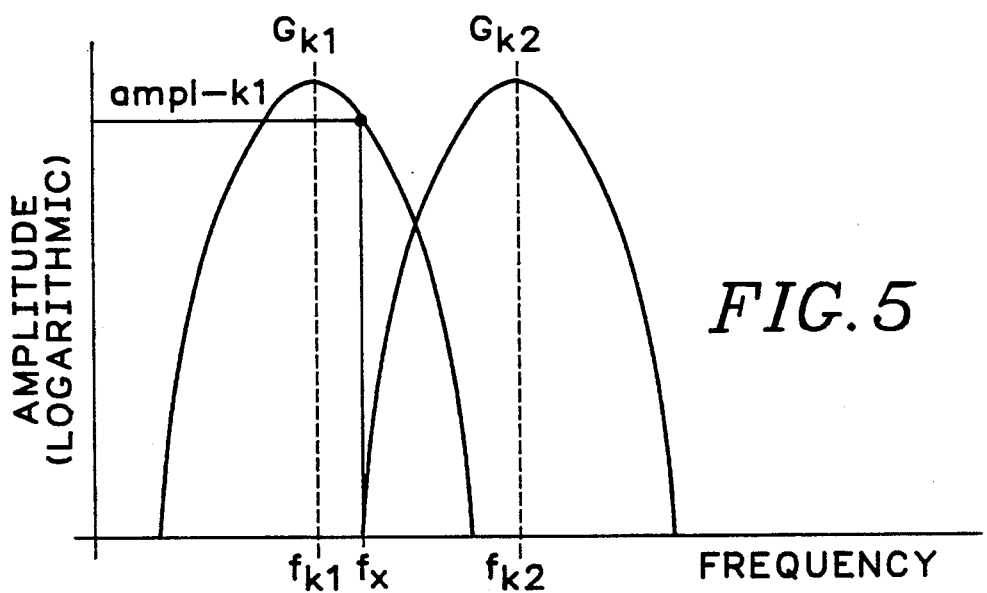
FIG. 5 is similar to FIG. 4, but with a different value for sigma-f.

Referring now to FIGS. 4 and 5, sigma-f in equation 3 is the width of one standard deviation measured in frequency. As sigma-f is made smaller, the filter shapes shown in FIG. 4 become narrower like those shown in FIG. 5. Up to a point, this is beneficial because it increases the frequency resolution that can be attained.

However, as shown in FIG. 5, when sigma-f is made too small, there is insufficient overlap between adjacent filters Note how, in FIG. 5, frequencies at or below (to the left of) fx will not register in filter GK2. Even frequencies slightly above fx in FIG. 5 might be difficult to measure because of noise fluctuations. Accordingly, there is a practical limit to how much the frequency resolution can be improved without running into these related problems of insufficient overlap and rolloff into the region where noise begins to interfere with the measurement.

As sigma-f is increased, not only is the frequency resolution diminished, but the problem of leakage from non-adjacent signals begins to increase. Some overlap, such as that shown in FIG. 4, is necessary, but it can be seen that as each filter is broadened, the potential for leakage from non-adjacent signals starts to increase rapidly. Note that, in FIG. 4, a second spectral line slightly above f,K3 would show up as part of the output of filter GK2. This potential for leakage puts a limit on how close other signals can be to a spectral line being measured by the present method.

There is also another factor to be considered in choosing a value for sigma-f. Making these Gaussian filter shapes have a small sigma-f in the frequency domain, means that their counterparts, sigma-t, in the time domain must be larger. This means that the impulse response of the filter gets longer, which means more multiplications/additions, and that more time is needed for the filter output to stabilize. A longer time record length also limits how short a pulse of pulsed RF can be and still fit within the time record. The time that is needed for the filter output to stabilize limits how fast a swept spectrum analyzer can sweep if it is employing a single one of these filters to make comparisons as the center frequency moves relative to a stable spectral line. output to stabilize limits how fast a swept spectrum analyzer can sweep if it is employing a single one of these filters to make comparisons as the center frequency moves relative to a stable spectral line.

As was discussed above, in the Background of the Invention, all of the filters in the bank of filters are just a replica of the filter centered around fc=0, a low pass filter.

Once a suitable level of sensitivity, that is a suitable value for sigma-f, has been determined, sigma-t can be calculated from sigma-f according to the following relation, equation 8:

$$\sigma_t = \frac{1}{2\pi\sigma_f} \quad (8)$$

For a filter centered on zero, fc=0 and tc=0. And, since sigma-t and tc are the only two parameters needed to determine the filter impulse response, the filter impulse response is determined from sigma-f. Demodulating and remodulating the signal effectively moves this zero-centered filter across the span of interest to create the required filter bank, as described above in the Background of the Invention.

However, the filter as described so far has an infinite impulse response. To limit it, some weighting function needs to be applied. This technique After a time record length has been selected and a window function has be applied to that time record, the actual response of the resulting filters is compared with the desired response to produce an indication of the difference between the desired and actual responses versus frequency. This difference between the desired response and the actual response of the resulting filters is then examined over two regions to ascertain how accurately the design criteria have been met. Within the bandpass region, this difference between the desired response and the actual response describes the fit of the actual results to the desired sigma-f. In the stopband region, this difference, to the extent that it is negative, indicates how inadequately sidelobe artifacts are suppressed. The latter, if inadequate, can be adjusted by increasing the window length or finding a more suitable windowing function.

The fit to the desired sigma-f can be improved by either of these methods or by putting an adjustment into the values of c1 and c2, so that the actual delta-log-Ampl results are more accurately convertible into correct frequency results. The modified values for c1 and c2 are found by doing a least squares fit of the values of equation (2) to the actual results until errors are satisfactorily minimized.

Figure 6:
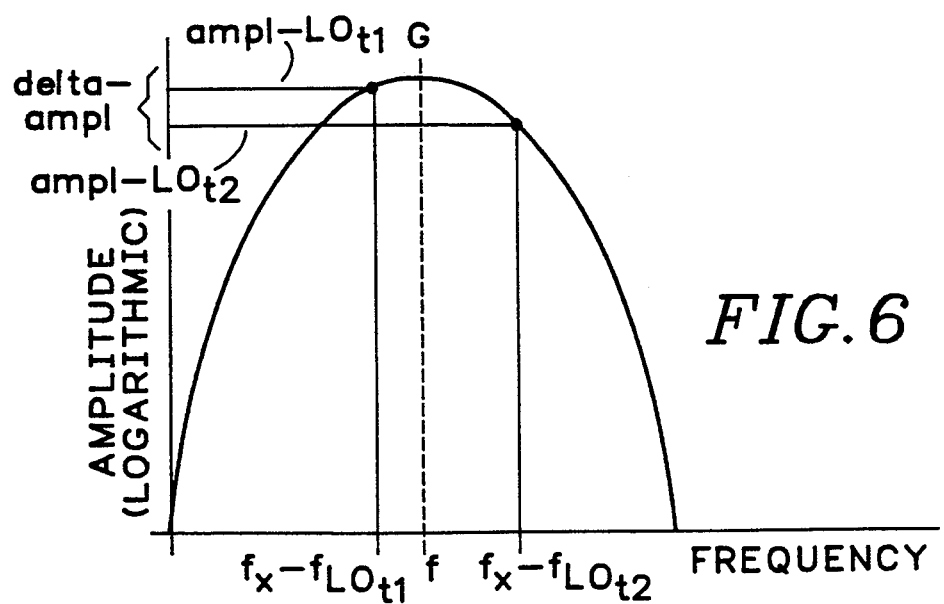
FIG. 6 shows the responses of one Gaussian filter at two times as the input signal is swept across the filter by a sweeping local oscillator.

Referring now to FIG. 6, the present invention can also be practiced using a single Gaussian filter and sweeping the unknown spectral line across it using a sweeping local oscillator. Equations (2), (3), and (4) can still be used to calculate the frequency fx of the unknown spectral line, if substitutions are made for f,k1 and f,k2 according to equations (9) and (10):

$$f_{k1} = fLO_{t1} + f \quad (9)$$

$$f_{k2} = fLO_{t2} + f \quad (10)$$

Figure 7:
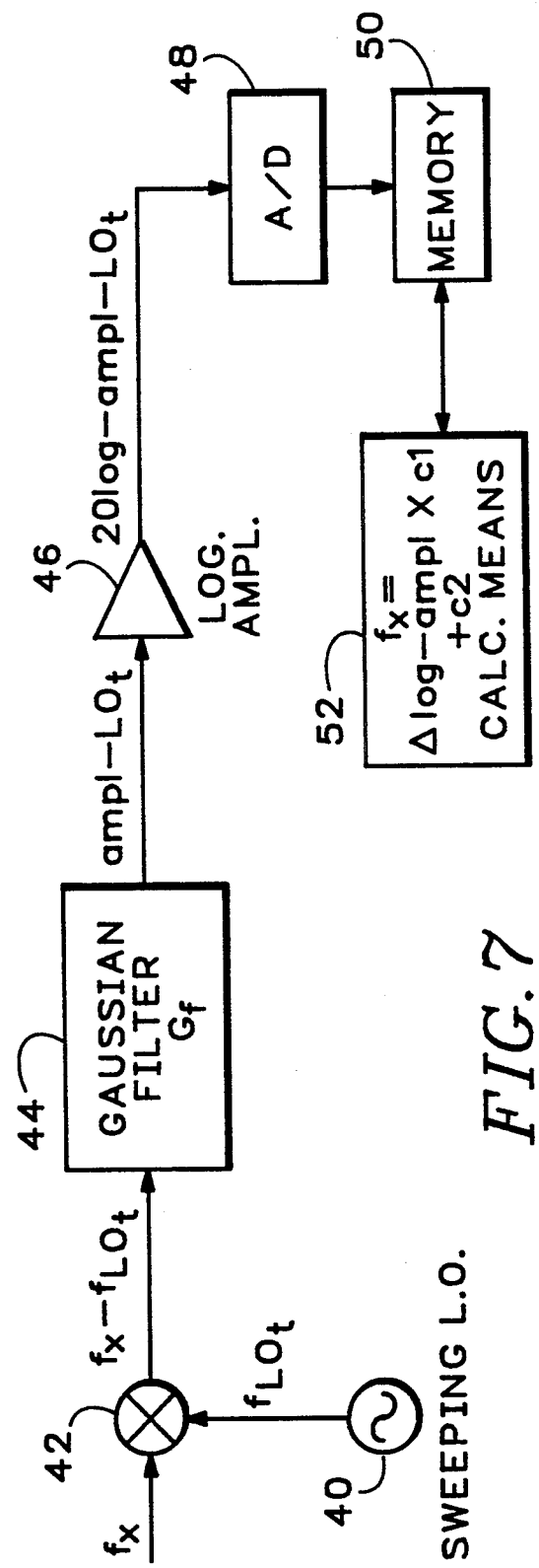
FIG. 7 is a block diagram of the circuitry used to practice the technique of the present invention using a single Gaussian filter.

Referring now to FIG. 7, to perform the technique of the present invention using a single Gaussian filter Gf 44, the output of a sweeping local oscillator 40 is mixed with the unknown signal fx by mixer 42. At a first time t1, this mixed signal (fx−f,LOt1) is applied to the Gaussian filter 44. The output of the Gaussian filter 44 at this time, ampl-LOt1, is applied to Logarithmic Amplifier 46 to produce 20log-ampl-LOt1. This analog signal may be converted to a digital quantity by A/D converter 48 and stored in Memory 50.

At another time, t2, the mixed signal (fx−f,LOt2) is applied to the Gaussian filter 44. The output of the Gaussian filter 44 at this time, ampl-LOt2, is applied to Logarithmic Amplifier 46 to produce 20log-ampl-LOt2. This analog signal may also be converted to a digital quantity by A/D converter 48 and also stored in Memory 50.

Calculating Means 52 can then retrieve the stored digital values of 20log-ampl-LOt1 and 20log-ampl-LOt2 and determine delta-log-ampl. The value of fx can be determined from delta-log-ampl according to equations (2), (3), and (4), after the substitutions of equation (9) and (10) are performed.

When this approach is used, c1 is proportional to the square of the standard deviation of the Gaussian filter and inversely proportional to the difference between the local oscillator frequencies, f,LOt1 and f,LOt2, times the logarithm of e, and c2 is the average of the local oscillator frequencies at the first and second times, f,LOt1 and f,LOt2, plus f, the center frequency of the Gaussian filter.

The use of analog-to-digital converter 48 and memory 50 is one of several possible implementations. Alternatively, in a more analog implementation, the output of the logarithmic amplifier 46, corresponding to the first measurement of the Gaussian filter 44 output, could be switched and delayed until it was time aligned with the output corresponding to the second measurement of the Gaussian filter output, thus permitting an analog comparator to measure the delta-log-ampl value.

While a preferred embodiment of the present invention has been shown and described, it will be apparent to those skilled in the art that many changes and modifications may be made without departing from the invention in its broader aspects. In particular, analog filter banks could be substituted for digital ones, or other logarithmic scales than decibels could be used with appropriate modifications to the equations shown. The claims that follow are therefore intended to cover all such changes and modifications as fall within the true spirit and scope of the invention.

I claim:

1. A method for rapidly and accurately determining the frequency, fx, of a spectral line comprising the steps of:

applying a signal containing the spectral line to at least two Gaussian filters having different center frequencies;

measuring the logarithmic amplitude of a response from each of the Gaussian filters to produce amplitudes log-ampl-1 and log-ampl-2, respectively;

taking the difference between log-ampl-1 and log-ampl-2 to produce a delta logarithmic amplitude, delta-log-ampl; and determining the frequency of the spectral line from the relationship between the response from the Gaussian filters according to the linear relationship fx = delta-log-ampl*c1+c2, where c1 is proportional to the square of the standard deviation of the Gaussian filters and inversely proportional to the difference between the different center frequencies times the logarithm of e, and where c2 is the midpoint between the different center frequencies.

2. A method for rapidly and accurately determining the frequency, fx, of a spectral line using a single Gaussian filter having a center frequency comprising the steps of:

at a first time a signal containing the spectral line mixed with the output of a local oscillator at a first frequency to the single Gaussian filter;

measuring the logarithmic amplitude of a first response from the single Gaussian filter to produce a first amplitude;

applying at a second time a signal containing the spectral line mixed with the output of a local oscillator at a second frequency to the single Gaussian filter;

measuring the logarithmic amplitude of a second response from the single Gaussian filter to produce a second amplitude;

taking the difference between the first and second amplitudes to produce a delta logarithmic amplitude, delta-log-ampl; and determining the frequency of the spectral line from the relationship between the two responses from the single Gaussian filter according to the linear relationship fx = delta-log-ampl*c1+c2, where c1 is proportional to the square of the standard deviation of the single Gaussian filter and inversely proportional to the difference between the first and second frequencies times the logarithm of e, and where c2 is the average of the first and second frequencies plus the center frequency.

3. A digital spectrum analyzer of the type having means for converting an analog signal to a series of digital numbers representing a time record of the signal and means for performing Discrete Fourier Transforms for operating on the time record of the signal to produce spectral data in an output of a plurality of filter bins, comprising:

means for producing Gaussian windows for shaping the output of the filter bins;

means for determining the logarithmic outputs of the filter bins; and means for determining from the logarithmic outputs of two adjacent filter bins a frequency of a spectral line according to the linear relationship fx = delta-log-ampl*c1+c2, where fx is the frequency of the spectral line, delta-log-ampl is the difference between the logarithmic outputs of the two adjacent filter bins, c1 is proportional to the square of the standard deviation of the Gaussian windows and inversely proportional to the difference between the center frequencies of the Gaussian windows times the logarithm of e, and c2 is the midpoint between the center frequencies.

4. An apparatus for determining the frequency, fx, of a spectral line comprising:
 a first Gaussian filter having a first center frequency that is lower than fx, having as input a signal containing the spectral line and producing a first amplitude output;
 a second Gaussian filter having a second center frequency that is higher than fx, having as input a signal containing the spectral line and producing a second amplitude output;
 means for producing logarithmic amplitudes from the first and second amplitude outputs;
 means for taking the difference between the logarithmic amplitudes to produce a delta logarithmic amplitude, delta-log-ampl; and
 means for determining the frequency of the spectral line from the relationship between the responses from the two Gaussian filters according to the linear relationship fx=delta-log-ampl*c1+c2, where c1 is proportional to the square of the standard deviation of the Gaussian filters and inversely proportional to the difference between the center frequencies times the logarithm of e, and where c2 is the midpoint between the center frequencies.

5. An apparatus for determining the frequency, fx, of a spectral line comprising:
 a sweeping local oscillator for producing an output frequency that varies with time such that the output frequency is a first frequency at a first time and a second frequency at a second time;
 means for frequency mixing a signal containing the spectral line with the output frequency to produce an intermediate frequency;
 a Gaussian filter having a center frequency, having as input the intermediate frequency and having as an output an amplitude signal;
 logarithmic amplitude producing means to produce from the output of the Gaussian filter logarithmic amplitude signals at the first and second times, respectively;
 means for taking the difference between the logarithmic amplitude signals to produce a delta logarithmic amplitude signal, delta-log-ampl; and
 means for determining the frequency of the spectral line from the relationship between the responses from the Gaussian filter at the first and second times according to the linear relationship fx=delta-log-ampl*c1=c2, where c1 is proportional to the square of the standard deviation of the Gaussian filter and inversely proportional to the difference between the first and second frequencies times the logarithm of e, and where c2 is the average of the first and second frequencies, plus the center frequency of the Gaussian filter.

* * * * *